US012200870B2

(12) United States Patent
Nitta

(10) Patent No.: US 12,200,870 B2
(45) Date of Patent: Jan. 14, 2025

(54) COMPONENT MOUNTING SYSTEM AND COMPONENT MOUNTING METHOD

(71) Applicant: YAMAHA HATSUDOKI KABUSHIKI KAISHA, Iwata (JP)

(72) Inventor: Hiroaki Nitta, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 526 days.

(21) Appl. No.: 17/442,528

(22) PCT Filed: Mar. 29, 2019

(86) PCT No.: PCT/JP2019/013984
§ 371 (c)(1),
(2) Date: Sep. 23, 2021

(87) PCT Pub. No.: WO2020/202248
PCT Pub. Date: Oct. 8, 2020

(65) Prior Publication Data
US 2022/0174850 A1    Jun. 2, 2022

(51) Int. Cl.
*H05K 13/04* (2006.01)
*H01L 21/677* (2006.01)
(Continued)

(52) U.S. Cl.
CPC ... *H05K 13/0404* (2013.01); *H01L 21/67736* (2013.01); *H05K 13/02* (2013.01); *H05K 13/085* (2018.08); *H05K 13/086* (2018.08)

(58) Field of Classification Search
CPC ............... H05K 13/02; H05K 13/021; H05K 13/0417; H05K 13/084; H05K 13/085;
(Continued)

(56) References Cited

U.S. PATENT DOCUMENTS

2016/0212899 A1* 7/2016 Jacobsson ......... H05K 13/0404
2016/0353624 A1* 12/2016 Maezono ............... H05K 13/08

FOREIGN PATENT DOCUMENTS

| CN | 108668518 A | 10/2018 |
| JP | 2001-326498 A | 11/2001 |

(Continued)

OTHER PUBLICATIONS

JP 2012-182246 translation (Year: 2024).*
(Continued)

*Primary Examiner* — Jeffrey T Carley
*Assistant Examiner* — Joshua D Anderson
(74) *Attorney, Agent, or Firm* — Studebaker & Brackett PC

(57) ABSTRACT

A component mounting system includes a component mounting device (15) configured to mount a component (E) on a board (S), a component storage (20) configured to store a component containing member (200) configured to contain a plurality of the components to be mounted on the board by the component mounting device, and a controller (22) configured to control an order in which the component containing member is unloaded from the component storage. The controller is configured to control the order in which the component containing member is unloaded based on an unloading priority when a plurality of the component containing members are scheduled to be unloaded.

13 Claims, 8 Drawing Sheets

(51) Int. Cl.
*H05K 13/02* (2006.01)
*H05K 13/08* (2006.01)

(58) Field of Classification Search
CPC ............. H05K 13/0857; H05K 13/086; H05K 13/087; H05K 13/0882; H01L 21/67736; Y10T 29/4913; Y10T 29/53174
See application file for complete search history.

(56) References Cited

FOREIGN PATENT DOCUMENTS

| | | |
|---|---|---|
| JP | 2002-164697 A | 6/2002 |
| JP | 2004-283994 A | 10/2004 |
| JP | 2004-363634 A | 12/2004 |
| JP | 2006-005332 A | 1/2006 |
| JP | 2009-182160 A | 8/2009 |
| JP | 2010-147124 A | 7/2010 |
| JP | 2012-182246 A | 9/2012 |
| JP | 2017-224720 A | 12/2017 |
| JP | 2018-164018 A | 10/2018 |
| JP | 2018-188282 A | 11/2018 |
| WO | 2018/154636 A1 | 8/2018 |
| WO | 2019/021365 A1 | 1/2019 |

OTHER PUBLICATIONS

WO 2018-154 636 translation (Year: 2024).*
An Office Action; "Notice of Reasons for Refusal", mailed by the Japanese Patent Office on May 10, 2022, which corresponds to Japanese Patent Application No. 2021-510592 and is related to U.S. Appl. No. 17/442,528; with English language translation.
Lian Xiao-qin et al., "Warehouse logistics control and management system based on electronic tag", Computer Engineering and Design, vol. 28, No. 10, pp. 2426-2429, May 23, 2007; with English abstract.
An Office Action mailed by China National Intellectual Property Administration on Jul. 19, 2022, which corresponds to Chinese Patent Application No. 201980094215.5 and is related to U.S. Appl. No. 17/442,528; with English language translation.
International Search Report issued in PCT/JP2019/013984; mailed Jun. 25, 2019.
Written Opinion issued in PCT/JP2019/013984; mailed Jun. 25, 2019.

* cited by examiner

COMPONENT MOUNTING SYSTEM AND COMPONENT MOUNTING METHOD

CROSS-REFERENCE TO RELATED APPLICATION

This application is a National Stage of International Patent Application No. PCT/JP2019/013984, filed Mar. 29, 2019, the entire content of which is incorporated herein by reference.

TECHNICAL FIELD

The present disclosure relates to a component mounting system and a component mounting method, and more particularly, it relates to a component mounting system including a component storage and a component mounting method using a component storage.

BACKGROUND ART

Conventionally, a component mounting system including a component storage is known. Such a component mounting system is disclosed in Japanese Patent Laid-Open No. 2018-164018, for example.

Japanese Patent Laid-Open No. 2018-164018 discloses a component mounting system including a mounter to mount components on a board, a component container storage (component storage) to store component containers that house the components to be mounted on the board by the mounter, and a preparation instruction unit to create preparation instructions for the component containers to be taken out from the component container storage. The component mounting system disclosed in Japanese Patent Laid-Open No. 2018-164018 is configured to sequentially unload the component containers from the component container storage based on the preparation instructions created by the preparation instruction unit.

SUMMARY

The component mounting system disclosed in Japanese Patent Laid-Open No. 2018-164018 is configured to sequentially unload the component containers from the component container storage based on the preparation instructions created by the preparation instruction unit. Therefore, depending on the order of the preparation instructions, unloading of the type of components that needs to be quickly supplied to a component mounting device due to a small number of remaining components may be postponed, and it may take a long time to supply the components to the component mounting device that requires component supply. In this case, it becomes difficult to continue the operation to mount the components on the board, and it is necessary to temporarily interrupt component mounting. Consequently, the efficiency of the operation to mount the components on the board is decreased.

Accordingly, the present disclosure provides a component mounting system and a component mounting method capable of significantly reducing or preventing a decrease in the efficiency of the operation to mount components on a board due to the unloading status of the components from a component storage.

A component mounting system according to a first aspect of the present disclosure includes a component mounting device configured to mount a component on a board, a component storage configured to store a component containing member configured to contain a plurality of the components to be mounted on the board by the component mounting device, and a controller configured to control an order in which the component containing member is unloaded from the component storage. The controller is configured to control the order in which the component containing member is unloaded based on an unloading priority when a plurality of the component containing members are scheduled to be unloaded.

The component mounting system according to the first aspect of the present disclosure is configured as described above such that the component containing members of the type of high-priority components that needs to be quickly supplied can be preferentially unloaded from the component storage, and thus the components can be quickly supplied to the component mounting device that requires component supply. Thus, temporary interruption of the operation of the component mounting device to mount the components on the board can be significantly reduced or prevented, and thus a decrease in the efficiency of the operation to mount the components on the board due to the unloading status of the components from the component storage can be significantly reduced or prevented.

In the aforementioned component mounting system according to the first aspect, the controller is preferably configured to control the order in which the component containing member is unloaded based on the unloading priority determined based on a period of time during which mounting on the board is continued with a remaining component in the component mounting device. Accordingly, the component containing members of the components, which have a short period of time during which mounting of the components is continued, can be preferentially unloaded from the component storage, and thus temporary interruption of the operation of the component mounting device to mount the components on the board can be effectively significantly reduced or prevented.

In this case, the component mounting system preferably further includes a priority determiner configured to determine the unloading priority of the component containing member based on information on a number of remaining components transmitted from the component mounting device at a predetermined timing. Accordingly, the unloading priority of a plurality of component containing members can be easily determined by the priority determiner based on the information on the number of remaining components in the component mounting device.

In the aforementioned component mounting system including the priority determiner, the priority determiner is preferably configured to create an unloading group of the component containing member based on the unloading priority. Accordingly, the component containing members having the same priority can be set as the same unloading group, and the unloading priority can be determined.

In this case, the controller is preferably configured to perform a control to unload the component containing member for each unloading group classified based on the unloading priority. Accordingly, the component containing members having a high priority can be collectively unloaded as an unloading group.

In the aforementioned component mounting system according to the first aspect, the controller is preferably configured to control an order of unloading such that a turn of the component containing member having a high unloading priority is advanced when a request to unload the component containing member having a high unloading priority arrives while the component containing member is being unloaded. Accordingly, the order of unloading can be changed even during unloading of the component containing member, and thus an increase in the time required to unload the component containing member of the type of components that needs to be quickly supplied can be more effectively significantly reduced or prevented.

In this case, the controller is preferably configured to perform a control to interrupt a process to sequentially unload the plurality of component containing members when the request to unload the component containing member having a high unloading priority arrives during the process to sequentially unload the plurality of component containing members, and unload the component containing member having a high unloading priority. Accordingly, unloading of the component containing members of a high-priority unloading group can be started without waiting for unloading of all the component containing members being processed.

In the aforementioned component mounting system configured to interrupt unloading of the component containing members of the unloading group that is being unloaded, the component containing members, unloading of which is interrupted, are preferably the component containing members that are supplied to the component mounting device and set up in order to start component mounting. Accordingly, the unloading priority of the component containing members to be set up is relatively low, and thus the influence on the operation to mount the components on the board can be significantly reduced or prevented even when the unloading is interrupted.

In the aforementioned component mounting system according to the first aspect, the controller is preferably configured to control the order in which the component containing member is unloaded based on the unloading priority set by a user. Accordingly, the component containing members can be quickly unloaded according to the user's request.

In addition, a component mounting method according to a second aspect of the present disclosure includes mounting a component on a board by a component mounting device, unloading, from a component storage, a component containing member configured to contain a plurality of the components to be mounted on the board by the component mounting device, and controlling an order in which the component containing member is unloaded based on an unloading priority when a plurality of the component containing members are scheduled to be unloaded in the component storage.

The component mounting method according to the second aspect of the present disclosure is configured as described above such that the component containing members of the type of high-priority components that needs to be quickly supplied can be preferentially unloaded from the component storage, and thus the components can be quickly supplied to the component mounting device that requires component supply. Thus, temporary interruption of the operation of the component mounting device to mount the components on the board can be significantly reduced or prevented, and thus it is possible to provide the component mounting method capable of significantly reducing or preventing a decrease in the efficiency of the operation to mount the components on the board due to the unloading status of the components from the component storage.

In the aforementioned component mounting method according to the second aspect, the controlling of the order in which the component containing member is unloaded preferably includes controlling the order in which the component containing member is unloaded based on the unloading priority determined based on a period of time during which mounting on the board is continued with a remaining component in the component mounting device. Accordingly, the component containing members of the components, which have a short period of time during which mounting of the components is continued, can be preferentially unloaded from the component storage, and thus temporary interruption of the operation of the component mounting device to mount the components on the board can be effectively significantly reduced or prevented.

In this case, the component mounting method preferably further includes determining the unloading priority of the component containing member based on information on a number of remaining components transmitted from the component mounting device at a predetermined timing. Accordingly, the unloading priority of a plurality of component containing members can be easily determined based on the information on the number of remaining components in the component mounting device.

In the aforementioned component mounting method including the determining of the unloading priority, the determining of the unloading priority of the component containing member preferably includes creating an unloading group of the component containing member based on the unloading priority. Accordingly, the component containing members having the same priority can be set as the same unloading group, and the unloading priority can be determined.

In this case, the controlling of the order in which the component containing member is unloaded preferably includes performing a control to unload the component containing member for each unloading group classified based on the unloading priority. Accordingly, the component containing members having a high priority can be collectively unloaded as an unloading group.

In the aforementioned component mounting method according to the second aspect, the controlling of the order in which the component containing member is unloaded preferably includes controlling an order of unloading such that a turn of the component containing member having a high unloading priority is advanced when a request to unload the component containing member having a high unloading priority arrives while the component containing member is being unloaded. Accordingly, the order of unloading can be changed even during unloading of the component containing member, and thus an increase in the time required to unload the component containing member of the type of components that needs to be quickly supplied can be more effectively significantly reduced or prevented.

According to the present disclosure, as described above, it is possible to provide the component mounting system and the component mounting method capable of significantly reducing or preventing a decrease in the efficiency of the operation to mount the components on the board due to the unloading status of the components from the component storage.

DETAILED DESCRIPTION

Figure 1:
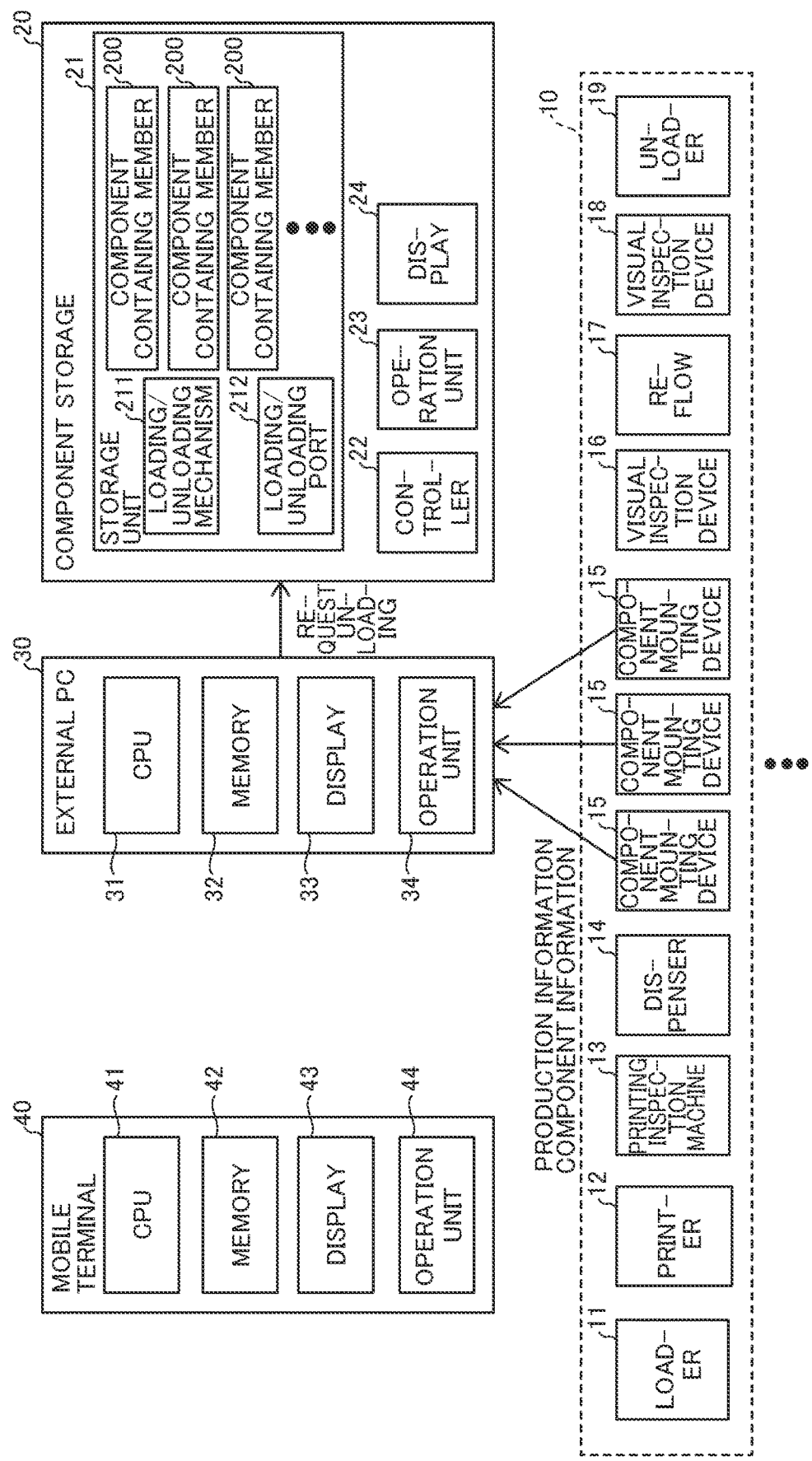
FIG. 1 is a block diagram showing a component mounting system according to an embodiment of the present disclosure.

An embodiment embodying the present disclosure is hereinafter described on the basis of the drawings.

The structure of a component mounting system 100 according to the embodiment of the present disclosure is now described with reference to FIGS. 1 and 2.
(Structure of Component Mounting System)

The component mounting system 100 according to this embodiment of the present disclosure is configured to mount components E on a board S to manufacture the board S on which the components E have been mounted. As shown in FIG. 1, the component mounting system 100 includes a component mounting line 10, a component storage 20, an external PC 30, and a mobile terminal 40 carried by a user. The external PC 30 is an example of a "priority determiner" in the claims.

A plurality of component mounting lines 10 are provided. The component mounting lines 10 each includes a loader 11, a printer 12, a printing inspection machine 13, a dispenser device 14, a plurality of component mounting devices 15, a visual inspection device 16, a reflow device 17, and a visual inspection device 18, and unloader 19. In the component mounting line 10, the board S is conveyed from the upstream side (left side) to the downstream side (right side) along the production line.
Structure of Component Mounting Line The structure of each device of the component mounting line 10 is now described.

The loader 11 has a role of holding the board (wiring board) S before the components E are mounted and carrying the board S into the component mounting line 10. The components E include small pieces of electronic components such as LSIs, ICs, transistors, capacitors, and resistors.

The printer 12 is a screen printer and has a function of applying cream solder on a mounting surface of the board S.

The printing inspection machine 13 has a function of inspecting the state of the cream solder printed by the printer 12.

The dispenser device 14 has a function of applying cream solder, an adhesive, etc. to the board S.

The component mounting devices 15 have a function of mounting components at predetermined mounting positions on the board S on which cream solder has been printed. A plurality of (three) component mounting devices 15 are arranged along the conveyance direction of the board S. The plurality of component mounting devices 15 have a similar structure. As shown in FIG. 2, the component mounting devices 15 each include a base 151, a pair of conveyors 152, component supply units 153, a head unit 154, a support 155, a pair of rails 156, and component recognition imagers 157, and a controller 158.

The pair of conveyors 152 are installed on the base 151 and convey the board S in an X direction. Furthermore, the pair of conveyors 152 hold the board S being conveyed in a stopped state at a mounting operation position. A distance between the pair of conveyors 152 in a Y direction can be adjusted according to the dimensions of the board S.

The component supply units 153 are arranged outside (Y1 and Y2 sides) of the pair of conveyors 152. Further, a plurality of tape feeders 153a are arranged in the component supply units 153.

The tape feeders 153a hold reels (component containing members 200 that contain a plurality of components E (see FIG. 1)) on which tapes that hold a plurality of components 31 at a predetermined interval are wound. The tape feeders 153a are configured to supply the components E from the tip ends of the tape feeders 153a by rotating the reels to feed the tapes that hold the components E. When the tape that holds the components E is finished, it is replaced with the next tape (reel). The tape (reel) (component containing member 200) for replacement is unloaded from the component storage 20 and replenished.

The head unit 154 is provided so as to move between an area above the pair of conveyors 152 and areas above the component supply units 153. Furthermore, the head unit 154 includes a plurality of (five) mounting heads 154a having nozzles attached to the lower ends, and a board recognition imager 154b.

The mounting heads 154a are configured to mount the components E on the board S. Specifically, the mounting heads 154a are configured to be movable up and down (movable in a Z direction), and are configured to suction and hold the components E supplied from the tape feeders 153a by a negative pressure generated at the tip ends of the nozzles by an air pressure generator and to mount the components E at the mounting positions on the board S.

The board recognition imager 154b is configured to image fiducial marks F of the board S in order to recognize the position and orientation of the board S. The positions of the fiducial marks F are imaged and recognized such that the mounting positions of the components E on the board S can be accurately acquired. The board recognition imager 154b is configured to image the board S from above (Z1 direction side).

The support 155 includes an X-axis motor 155a. The support 155 is configured to move the head unit 154 in the X direction along the support 155 by driving the X-axis motor 155a. Opposite ends of the support 5 are supported by the pair of rails 156.

The pair of rails 156 are fixed on the base 151. A rail 156 on the X1 side includes a Y-axis motor 156a. The rails 156 are configured to move the support 155 in the Y direction orthogonal to the X direction along the pair of rails 156 by driving the Y-axis motor 156a. The head unit 4 is movable in the X direction along the support 5, and the support 5 is movable in the Y direction along the rails 156 such that the head unit 4 is movable in the X and Y directions.

The component recognition imagers 157 are fixed on the upper surface of the base 151. The component recognition imagers 157 are arranged outside (Y1 and Y2 sides) of the pair of conveyors 152. The component recognition imagers 157 are configured to image the components E suctioned by the nozzles of the mounting heads 154a from below (Z2 direction side) in order to recognize the suction states (suction orientations) of the components E prior to mounting of the components E. Thus, the suction states of the components E suctioned by the nozzles of the mounting heads 154a can be acquired.

The controller 158 includes a CPU, and is configured to control the overall operation of the component mounting device 15 such as the board S conveying operation performed by the pair of conveyors 152, the mounting operation performed by the head unit 154, and the imaging operations performed by the component recognition imagers 157 and the board recognition imager 154b. Furthermore, the controller 158 is configured to transmit information such as production information and component information to the external PC 30.

Figure 2:
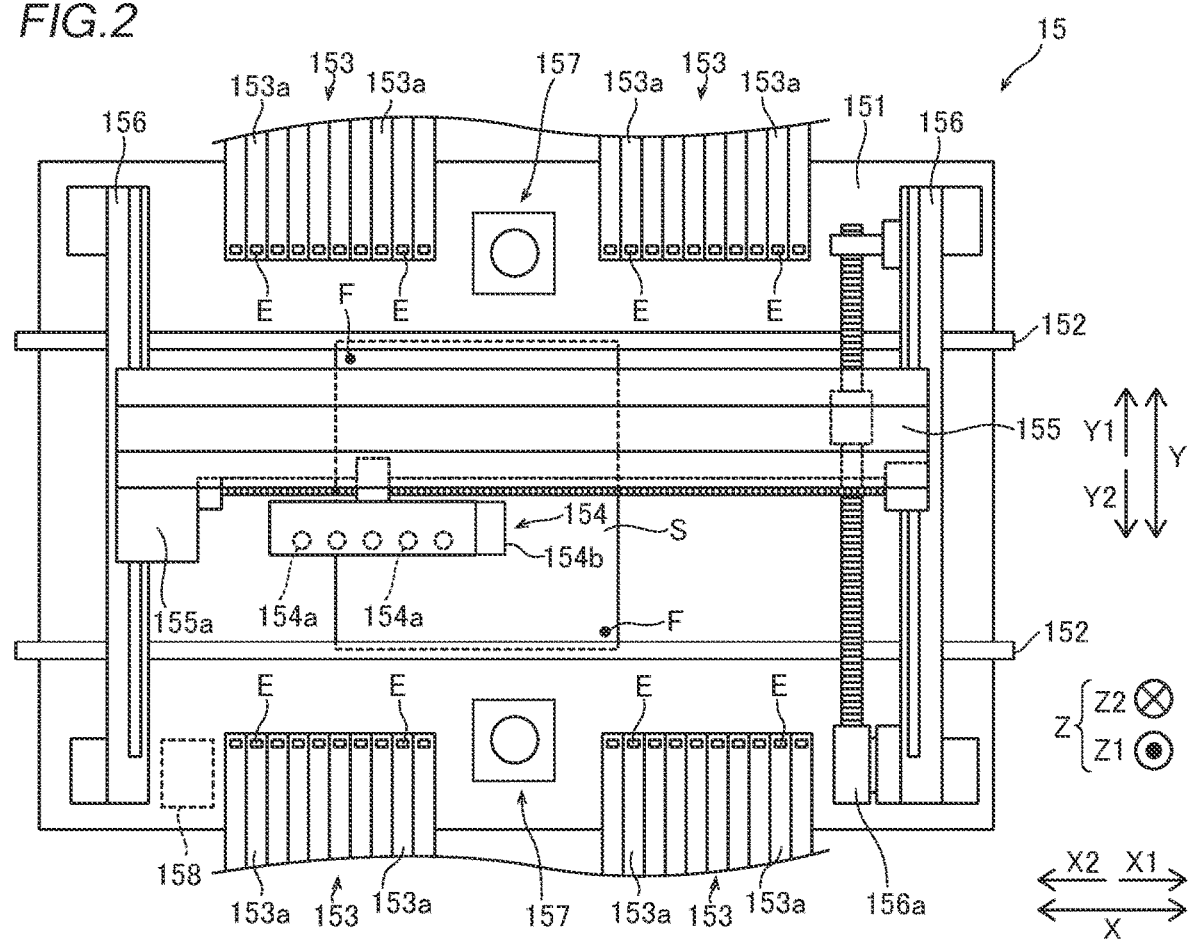
FIG. 2 is a diagram showing the overall structure of a component mounting device of the component mounting system according to the embodiment of the present disclosure.

As shown in FIG. 1, the visual inspection device 16 is provided downstream of the plurality of component mounting devices 15. The visual inspection device 16 has a function of inspecting the appearance of the board S on which the components E have been mounted by the component mounting devices 15.

The reflow device 17 has a function of melting the solder by performing a heat treatment and joining the components E to electrode portions of the board S. The reflow device 17 is configured to perform a heat treatment while conveying the board S on the lane.

The visual inspection device 18 is provided downstream of the reflow device 17. The visual inspection device 18 has a function of inspecting the appearance of the board S heat-treated by the reflow device 17.

The unloader 19 has a role of discharging the board S on which the components E have been mounted from the component mounting line 10.

Structure of Component Storage

The structure of the component storage 20 is now described.

The component storage 20 is configured to store the component containing members 200 that contain a plurality of components E to be mounted on the board S by the component mounting devices 15. The component storage 20 includes a storage unit 21, a controller 22, an operation unit 23, and a display 24. The storage unit 21 includes a loading/unloading mechanism 211 and a loading/unloading port 212.

The storage unit 21 is configured to store a plurality of component containing members 200. Information on each of the plurality of component containing members 200 stored in the storage unit 21 is stored and managed in a memory. The information on the component containing member 200 includes information on the type of components E, information on the number of components E to be held, information on a storage location, and time information such as storage time. The loading/unloading mechanism 211 has a function of conveying the component containing member 200. Specifically, the loading/unloading mechanism 211 conveys the component containing member 200 placed in the loading/unloading port 212 and loads the component containing member 200 to a predetermined storage position of the storage unit 21. Furthermore, the loading/unloading mechanism 211 conveys the component containing member 200 stored in the storage unit 21 and unloads the component containing member 200 to the loading/unloading port 212. A plurality of component containing members 200 can be arranged in the loading/unloading port 212. That is, the plurality of component containing members 200 can be loaded and unloaded in the storage unit 21 at the same time.

For example, the loading/unloading port 212 includes a component placement shelf (not shown) including a plurality of stages. The component containing member 200, which is sequentially conveyed by the loading/unloading mechanism 211, is placed on each of the stages of the component placement shelf. When unloading is completed, a worker (user) can take out the component containing member 200 from each of the stages of the component placement shelf. On the component placement shelf, the component containing members 200 belonging to an unloading instruction file are arranged in order in succession in units of unloading instruction file described below. The worker takes out the component containing member 200 after the arrangement of all the component containing members 200 belonging to the unloading instruction file on the component placement shelf is completed. When the number of component containing members 200 in the unloading instruction file is larger than the number of stages of the component placement shelf, the worker takes out all the arranged component containing members 200 after the component containing members 200 are arranged on all the stages of the component loading shelf, and then the remaining component containing members 200 belonging to the unloading instruction file are placed on the component placement shelf.

The controller 22 is configured to control each portion of the component storage 20. Specifically, the controller 22 performs a control to unload the component containing members 200 from the storage unit 21 in response to an unloading request from the external PC 30.

In this embodiment, the controller 22 is configured to control the order in which the component containing members 200 are unloaded from the component storage 20. Furthermore, the controller 22 is configured to control the order in which the component containing members 200 are unloaded based on the unloading priority when the plurality of component containing members 200 are scheduled to be unloaded. That is, the controller 22 is configured to perform a control to preferentially unload the component containing members 200 having a high priority (high urgency of unloading).

The controller 22 is configured to control the order in which the component containing members 200 are unloaded based on the priority determined based on a period of time during which mounting on the board S can be continued with the remaining components E in the component mounting device 15. Furthermore, the controller 22 is configured to perform a control to unload the component containing members 200 for each unloading group classified based on the unloading priority.

The controller 22 is configured to control the order of unloading such that the turn of the component containing member 200 having a high unloading priority is advanced when a request to unload the component containing member 200 having a high unloading priority arrives while the component containing member 200 is being unloaded. Furthermore, the controller 22 is configured to perform a control to interrupt a process to sequentially unload a plurality of component containing members 200 when a request to unload the component containing member 200 having a high unloading priority arrives during the process to sequentially unload the plurality of component containing members 200, and unload the component containing member 200 having a high unloading priority.

For example, the component containing members 200, the unloading of which is interrupted, are component containing members 200 that are supplied to the component mounting device 15 and set up in order to start component mounting.

The controller 22 is configured to control the order in which the component containing members 200 are unloaded based on the priority set by the user.

Figure 4:
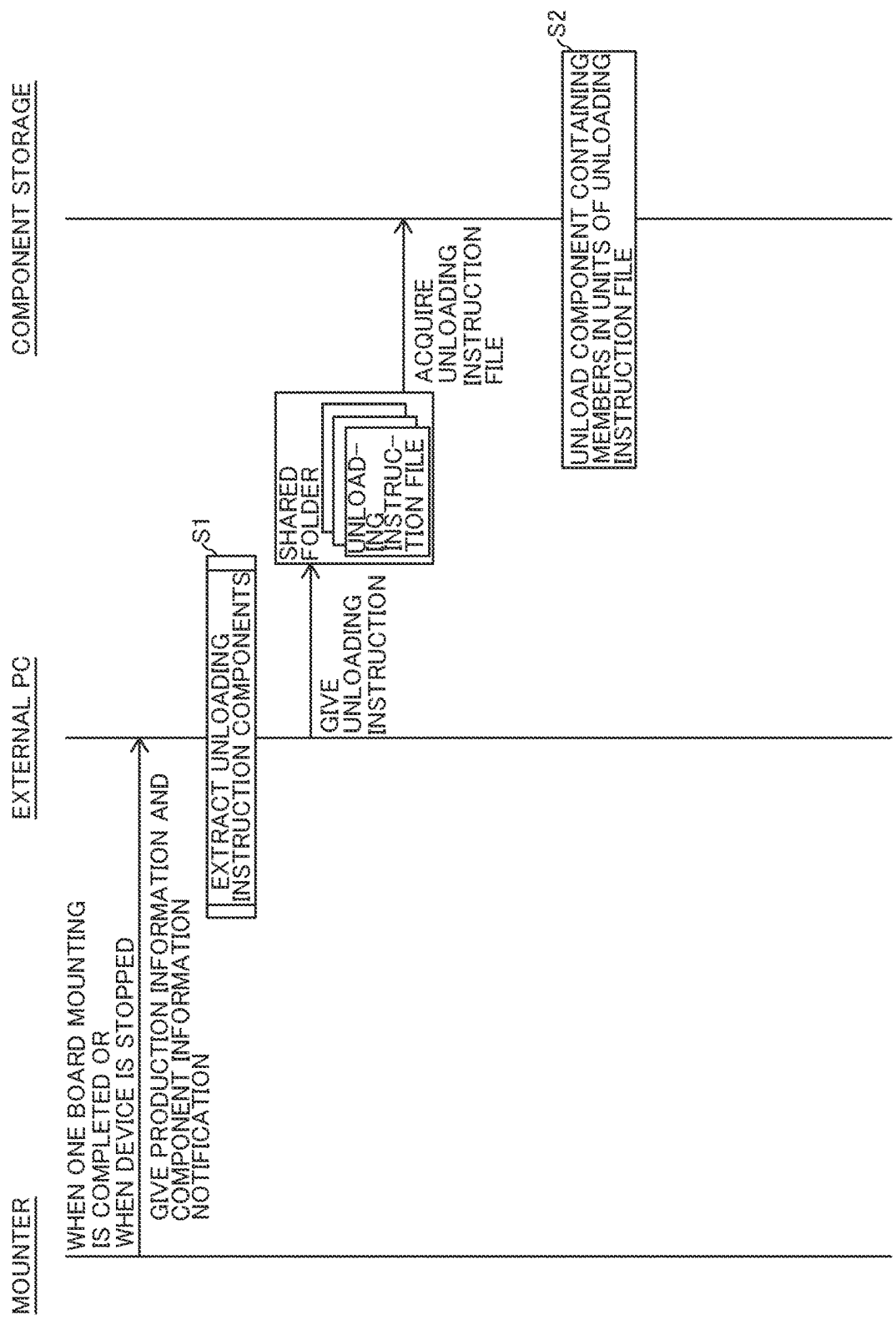
FIG. 4 is a sequence diagram for illustrating a first operation example of the component mounting system according to the embodiment of the present disclosure.

As shown in FIG. 4, the controller 22 acquires the unloading instruction file created by the external PC 30 from a shared folder. Furthermore, the controller 22 performs a control to sequentially unload the component containing members 200 based on the acquired unloading instruction file. The unloading instruction file stores data of one unloading group described above.

The operation unit 23 receives an operation from the user. The operation unit 23 includes an input such as a keyboard or a mouse, and a reader such as a barcode reader. The operation unit 23 receives a user's instruction based on a user's input from the keyboard or the mouse. Furthermore, the operation unit 23 reads an identifier (such as a bar code or an IC tag) attached to the component containing member 200 by the reader, and receives information on the component containing member 200 to be loaded and unloaded.

The display 24 displays the state of the component storage 20 and a screen for operation. Furthermore, the display 24 displays a notification issued from the component storage 20.

Structure of External PC

The structure of the external PC (personal computer) 30 is now described.

The external PC 30 manages the component mounting lines 10. Furthermore, the external PC 30 manages unloading of the component containing members 200 based on production information and component information transmitted from the component mounting devices 15.

The external PC 30 includes a central processing unit (CPU) 31, a memory 32, a display 33, and an operation unit 34. The CPU 31 controls each portion of the external PC 30. The CPU 31 executes a predetermined program using the memory 32. The display 33 displays a screen for operating the external PC 30. The operation unit 34 receives an operation from the user. The operation unit 34 includes an input such as a keyboard or a mouse.

In this embodiment, the external PC 30 is configured to determine the unloading priority of the component containing members 200 based on information on the number of remaining components transmitted from the component mounting device 15 at the predetermined timing. Furthermore, the external PC 30 is configured to create unloading groups of the component containing members 200 based on the unloading priority.

The external PC 30 calculates the producible time based on the production information (the cycle time of one board and the number of components used for one board) transmitted from each of the plurality of component mounting devices 15 and the component information (the number of remaining components) at regular time intervals. The external PC 30 extracts unloading requested components requested to be unloaded to the component storage 20 based on the calculated producible time. The external PC 30 creates the unloading groups in order from the one with the shortest producible time based on the extracted unloading requested components. The external PC 30 stores the created unloading groups in the shared folder such that the controller 22 can use them.

Structure of Mobile Terminal

The structure of the mobile terminal 40 is now described.

The mobile terminal 40 is carried by the user who manages the component mounting system 100. The mobile terminal 40 receives information on the component mounting system 100 and displays it on a display 43.

The mobile terminal 40 includes a central processing unit (CPU) 41, a memory 42, the display 43, and an operation unit 44. The CPU 41 controls each portion of the mobile terminal 40. Furthermore, the CPU 41 executes a predetermined program using the memory 42. The display 43 displays a screen for operating the mobile terminal 40. The operation unit 44 receives an operation from the user. The operation unit 44 includes an input such as a touch panel.

Description of Unloading Request List

Figure 3:
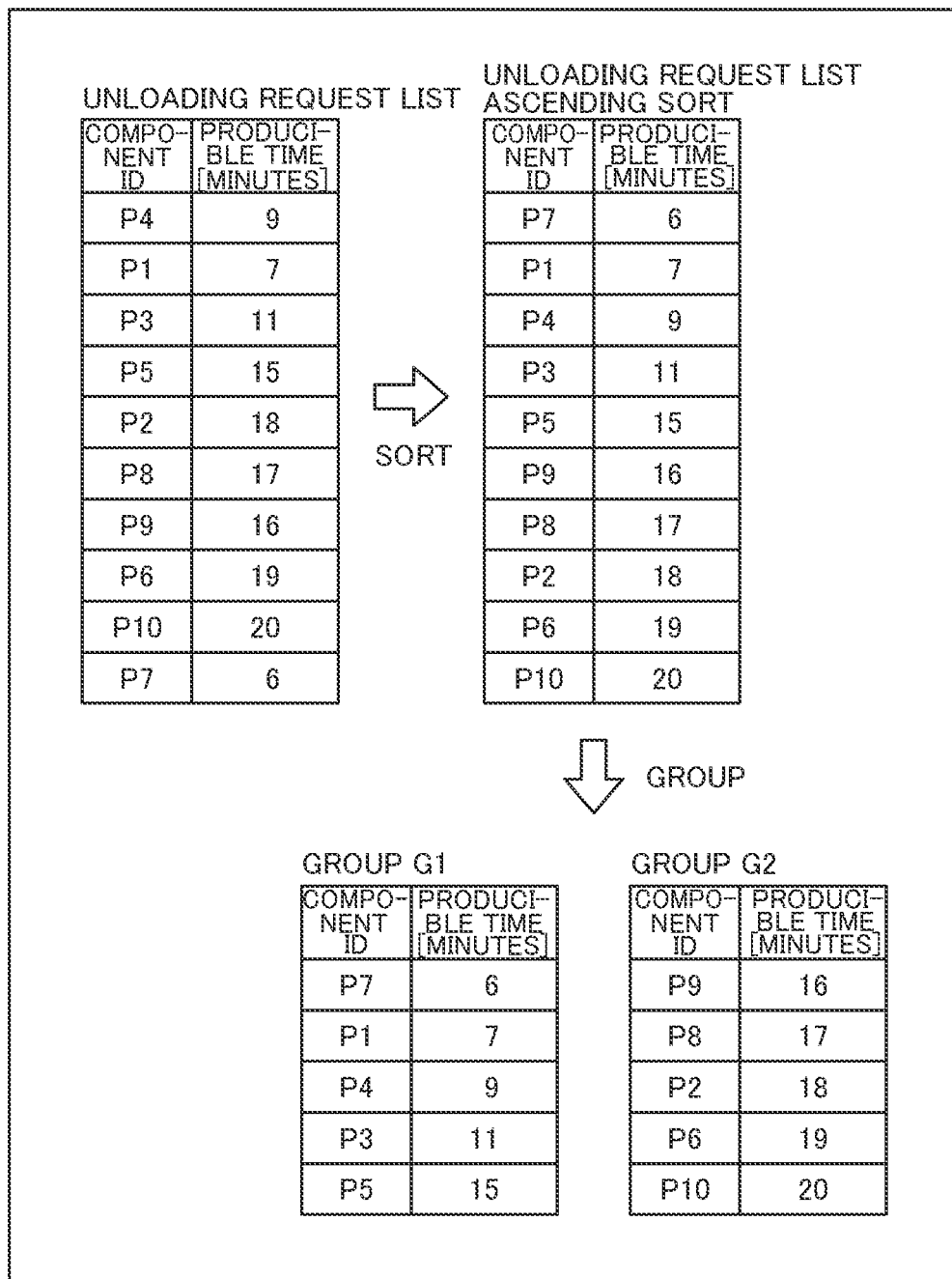
FIG. 3 is a diagram showing an example of an unloading request list in the component mounting system according to the embodiment of the present disclosure.

The unloading request list is now described with reference to FIG. 3.

The unloading request list is created by the external PC 30. In the component storage 20, unloading is completed with all the requested components arranged in the loading/unloading port 212, and the component containing member 200 can be taken out from the loading/unloading port 212. The component storage 20 unloads one component containing member 200 in t1 seconds on average. Furthermore, the component storage 20 can unload a1 component storage members 200 to the loading/unloading port 212 at the maximum. That is, when the maximum number of a1 component containing members 200 is requested, a time of t2 (=t1×a1) seconds is required for unloading. Furthermore, it takes a working time from unloading of the component containing member 200 to setting in the corresponding component mounting device 15. Therefore, a group of an unloading request is created in consideration of the producible time, the unloading time, and the working time.

Component Unloading Process (First Operation Example)

A component unloading process according to a first operation example is now described with reference to FIGS. 4 to 6.

As shown in FIG. 4, the component mounting device 15 notifies the external PC 30 of the production information and the component information. The external PC 30 is notified of the production information and the component information when one board mounting is completed or when the component mounting device 15 is stopped. The external PC 30 may be notified of the production information and the component information at predetermined time intervals according to the settings.

The external PC 30 that has received the production information and component information notification extracts unloading instruction components in step 1. When the unloading instruction components are extracted, the external PC 30 stores the unloading instruction file in the shared folder. The unloading instruction file is stored for each group according to the unloading priority.

The component storage 20 (controller 22) checks the shared folder, and acquires the unloading instruction file when there is the unloading instruction file. At this time, the controller 22 deletes the unloading instruction file acquired from the shared folder. Thus, duplicate acquisition of the unloading instruction file is significantly reduced or prevented. In step S2, the controller 22 that has acquired the unloading instruction file unloads the component containing members 200 in units of unloading instruction file.

The extraction process of the unloading instruction components in step S1 of FIG. 4 is now described with reference to FIG. 5. The extraction process of the unloading instruction components is performed by the external PC 30.

Figure 5:
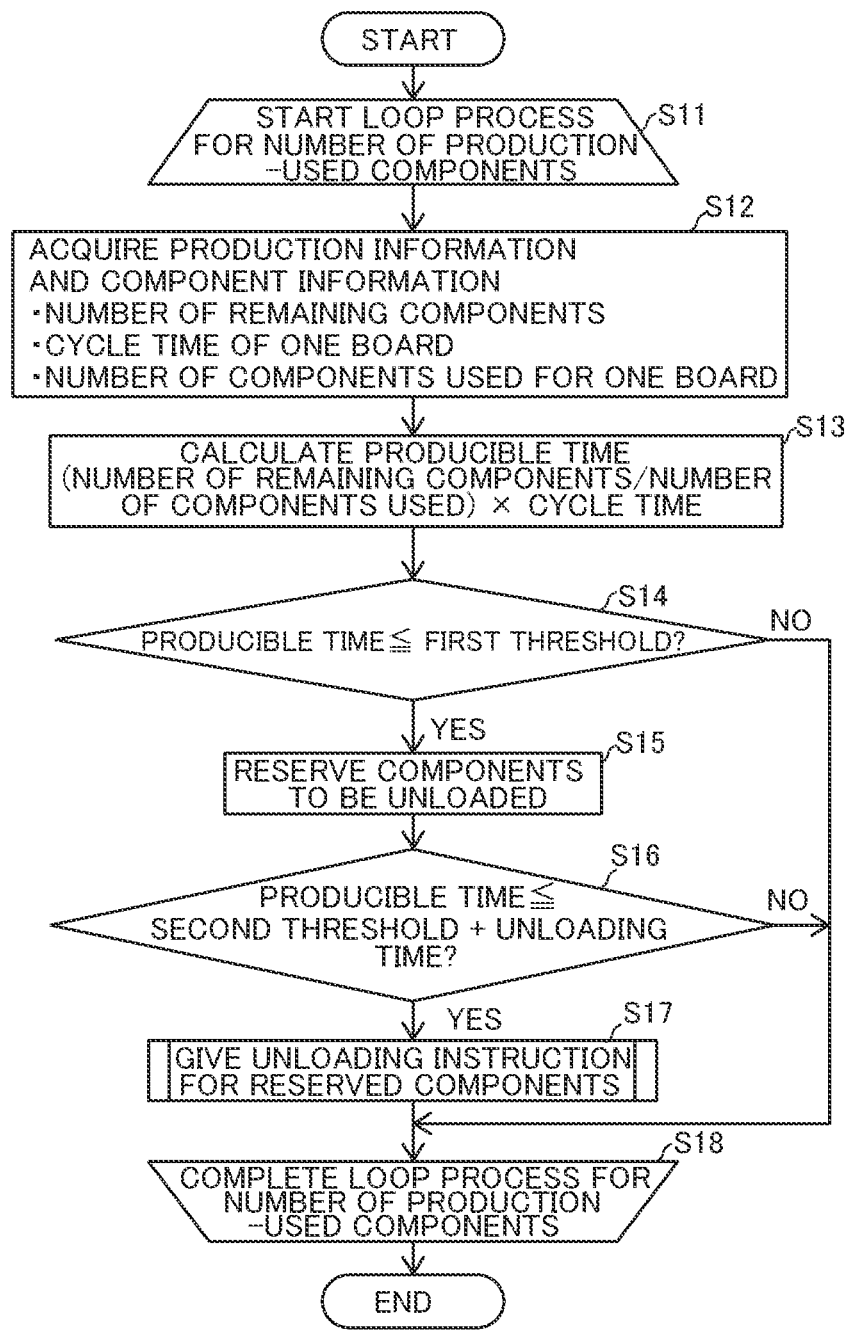
FIG. 5 is a flowchart for illustrating an extraction process of unloading instruction components of the component mounting system according to the embodiment of the present disclosure.

In step S11 of FIG. 5, a loop process for the number of production-used components is started. That is, in the mounting operation of the corresponding component mounting device 15, the extraction process is performed on all types of components E used. In step S12, the production information (the cycle time of one board S and the number of components E used for one board) and the component information (the number of remaining components of the component mounting device 15) are acquired.

In step S13, the producible time is calculated. Specifically, the producible time is calculated by=((number of remaining components)/(number of components used))×(cycle time). A producible number (=(number of remaining components)/(number of components used)) may be calculated instead of the producible time. In step S14, it is determined whether or not the calculated producible time is equal to or less than a first threshold. When it is equal to or less than the first threshold, the process advances to step S15, and when it is greater than the first threshold, the process advances to step S18. The first threshold is set based on the time during which unloading is possible. For example, the first threshold is set based on the time during which a new reel can be supplied to the tape feeder 153*a*. In other words, the first threshold is set based on the producible time during which a new reel can be supplied.

In step S15, the components to be unloaded are reserved. Specifically, the component containing member 200 of the corresponding components E is registered in the unloading request list. In step S16, it is determined whether or not the calculated producible time is equal to or less than a second threshold+the unloading time. When it is equal to or less than the second threshold+the unloading time, the process advances to step S17, and when it is greater than the second threshold+the unloading time, the process advances to step S18. The second threshold is set to a value smaller than the first threshold. Furthermore, the second threshold is set based on the required unloading time. The second threshold is set based on the moving time to the component storage 20+the mounting time of the component containing member 200+the margin time. The unloading time is calculated by the unloading time of one component containing member 200×the reserved number of component containing members to be unloaded.

In step S17, an unloading instruction for the reserved components is given. In step S18, when the loop process for the number of production-used components is completed, the extraction process of the unloading instruction components is terminated. When the loop process is not completed, the process operations in step S12 to step S17 are repeated.

An unloading instruction process of the reserved components in step S17 of FIG. 5 is now described with reference to FIG. 6. The unloading instruction process of the reserved components is performed by the external PC 30.

Figure 6:
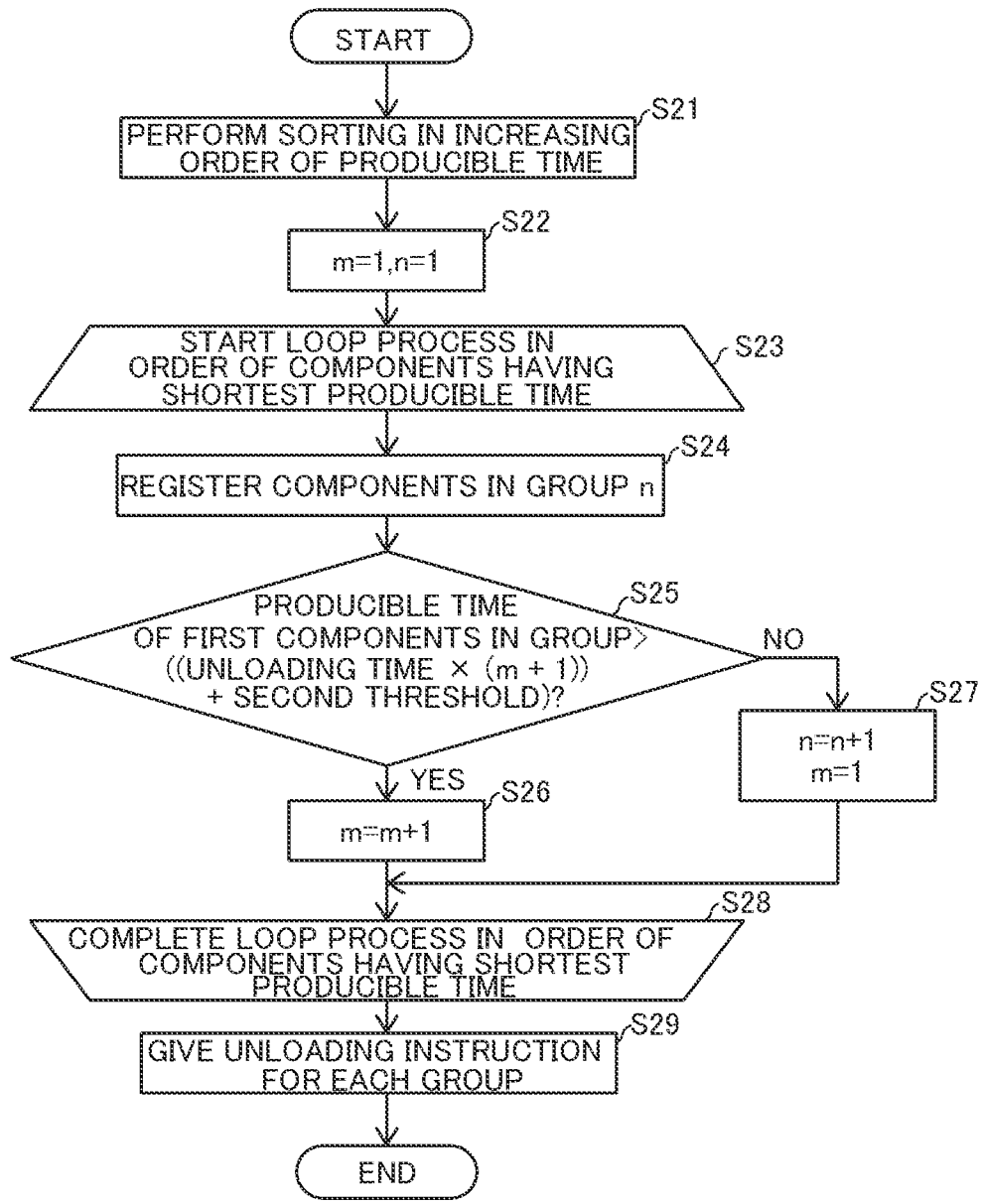
FIG. 6 is a flowchart for illustrating an unloading instruction process of reserved components of the component mounting system according to the embodiment of the present disclosure.

In step S21 of FIG. 6, sorting is performed in increasing order of the producible time. In step S22, m=1 and n=1 where m represents the number of registered components in a group, and n represents the number of groups. In step S23, the loop process is started in the order of the components having the shortest producible time.

In step S24, the components are registered in group n. As the group number decreases, the priority increases (the unloading priority order advances). That is, the components having the shortest producible time are registered in group 1. In step S25, it is determined whether or not the producible time of the first (with the shortest producible time) components in the group is greater than ((unloading time×(m+1))+second threshold). When it is greater, the process advances to step S26, and when it is not greater, the process advances to step S27. That is, in the shipment of the component containing member 200 of the corresponding group, it is determined whether or not the components having the shortest producible time can be supplied in time.

In step S26, m=m+1. In step S27, n=n+1 and m=1. When the loop process in order from the components having the shortest producible time is completed in step S28, the process advances to step S29, and an unloading instruction is given for each group. When the loop process is not completed, the process operations in step S24 to step S27 are repeated.

An example of the unloading instruction process of the reserved components is now described with reference to FIG. 3.

First, from the unloading request list, sorting is performed in increasing order of the producible time. In the example of FIG. 3, the first threshold is set to 20 minutes, and the moving time is set to 1 minute. Furthermore, the component mounting time is set to 1.5 minutes, and the margin time is set to 1 minute. The unloading time of one component containing member 200 is set to 0.5 minutes.

First, a group is set for a component ID of P7 (6 minutes). P7 is a first component, and thus it is set in group G1. In this case, the time until component mounting is the unloading time (0.5 minutes)+the moving time (1 minute)+the mounting time (1.5 minutes)+the margin time (1 minute)=4 minutes.

Next, a group is set for a component ID of P1 (7 minutes). In this case, the time until the first component mounting is the unloading time (1 minute)+the moving time (1 minute)+the mounting time (1.5 minutes)+the margin time (1 minute)=4.5 minutes. Therefore, the producible time of P7 is 6 minutes or less, and thus P1 is set in group G1.

Next, a group is set for a component ID of P4 (9 minutes). In this case, the time until the first component mounting is the unloading time (1.5 minutes)+the moving time (1 minute)+the mounting time (1.5 minutes)+the margin time (1 minute)=5 minutes. Therefore, the producible time of P7 is 6 minutes or less, and thus P4 is set in group G1.

Next, a group is set for a component ID of P3 (11 minutes). In this case, the time until the first component mounting is the unloading time (2 minutes)+the moving time (1 minute)+the mounting time (1.5 minutes)+the margin time (1 minute)=5.5 minutes. Therefore, the producible time of P7 is 6 minutes or less, and thus P3 is set in group G1.

Next, a group is set for a component ID of P5 (15 minutes). In this case, the time until the first component mounting is the unloading time (2.5 minutes)+the moving time (1 minute)+the mounting time (1.5 minutes)+the margin time (1 minute)=6 minutes. Therefore, the producible time of P7 is 6 minutes or less, and thus P5 is set in group G1.

Next, a group is set for a component ID of P9 (16 minutes). In this case, the time until the first component mounting is the unloading time (3 minutes)+the moving time (1 minute)+the mounting time (1.5 minutes)+the margin time (1 minute)=6.5 minutes. Therefore, the producible time of P7 is longer than 6 minutes, and thus P9 is set in group G2.

The producible times of P8 (17 minutes), P2 (18 minutes), P6 (19 minutes), and P10 (20 minutes) are also longer than the producible time of P7, which is 6 minutes, and thus P8, P2, P6, and P10 are set in group G2.

Component Unloading Process (Second Operation Example)

A component unloading process according to a second operation example is now described with reference to FIG. 7.

Also in the case of the second operation example, an unloading instruction for the component containing member 200 is given by the unloading instruction file as shown in the flow shown in FIG. 4. In this case, the unloading instruction file may store unloading groups created by the same process as in the first operation example. Furthermore, the unloading instruction file may store a group of only component IDs obtained by extracting component IDs, the producible time of which is less than the predetermined first threshold in step S14 of FIG. 5, at predetermined time intervals. That is, a group in the state of the unloading request list of FIG. 3 that is not grouped by the second threshold in step S16 of FIG. 5 may be stored in the unloading instruction file.

In the component unloading process according to the second operation example, the priority of the components currently being unloaded is compared with the priority of the requested components, and the component containing members 200 having a higher priority are unloaded. When the requested components have a higher priority, the current unloading operation is interrupted, and the requested components are unloaded. In determination of the priority, the one with the shorter time until running out of unloading execution components has a higher priority.

Figure 7:
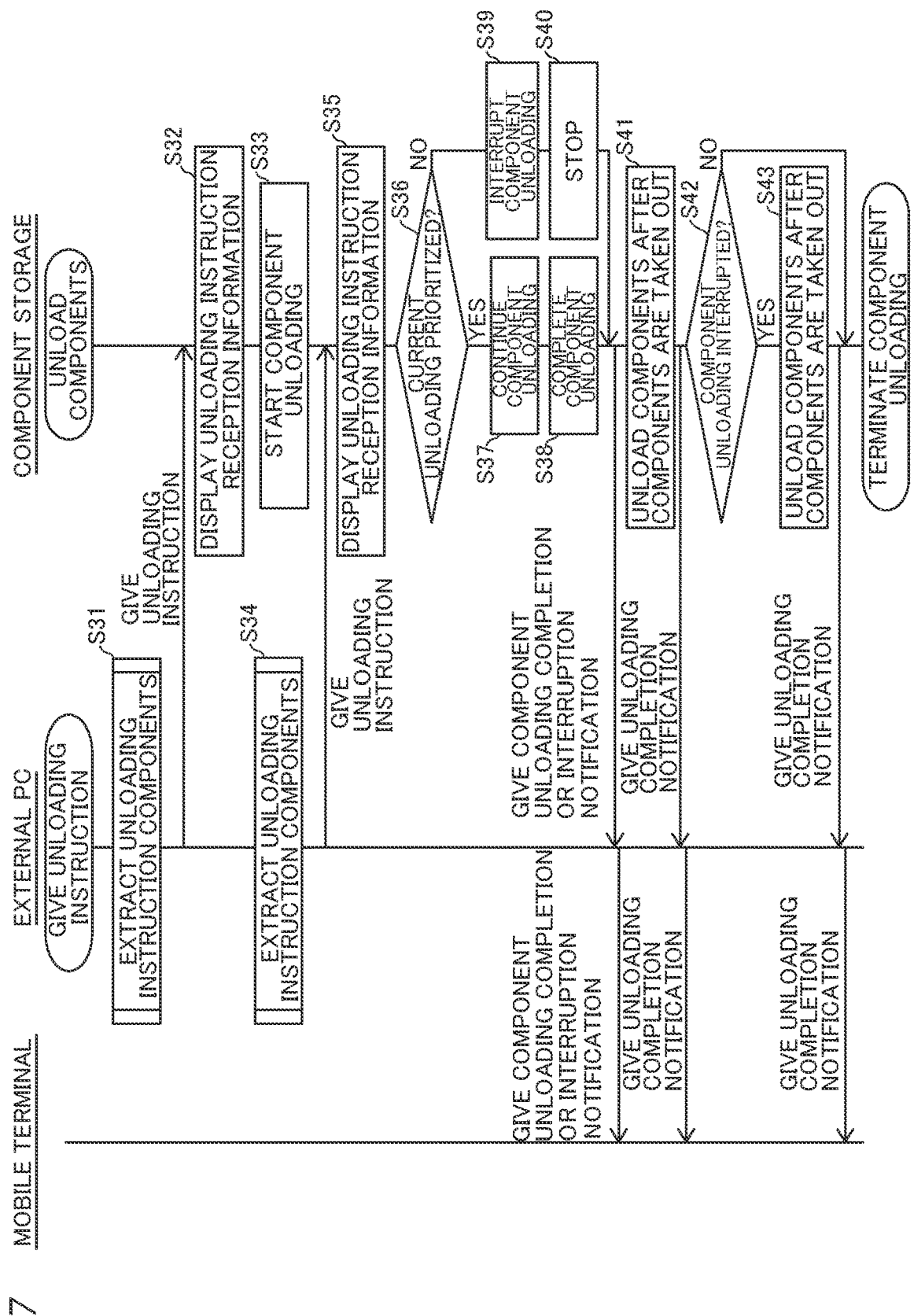
FIG. 7 is a sequence diagram for illustrating a second operation example of the component mounting system according to the embodiment of the present disclosure.

In step S31 of FIG. 7, the unloading instruction components are extracted by the external PC 30, and the unloading instruction is transmitted. In step S32, the component storage 20 (controller 22) causes the display 24 to display unloading instruction reception information. In step S33, the controller 22 starts component unloading.

In step S34, the unloading instruction components are extracted by the external PC 30, and the unloading instruction is transmitted. In step S35, the component storage 20 (controller 22) causes the display 24 to display unloading instruction reception information. In step S36, the controller 22 determines whether or not the current unloading of the component containing members 200 is prioritized. When the current unloading of the component containing members 200 is prioritized, the process advances to step S37, and when unloading of the component containing members 200 for the unloading instruction based on step S34 is prioritized, the process advances to step S39.

In step S37, the current unloading of the component containing members 200 is continued. In step S38, the component unloading is completed. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43. The user who has received the notification of the completion of component unloading performs an operation to take out the component containing member 200 unloaded from the component storage 20.

In step S39, the current unloading of the component containing members 200 is interrupted. In step S40, the component unloading is stopped. Then, the controller 22 notifies the external PC 30 of the interruption of component unloading. The external PC 30 displays information on the interruption of component unloading on the display 33. In addition, the external PC 30 notifies the mobile terminal 40 of the interruption of component unloading. The mobile terminal 40 displays information on the interruption of component unloading on the display 43. The user who has received the notification of the completion of component unloading performs an operation to take out the component containing member 200 unloaded from the component storage 20 before the interruption.

In step S41, after the previous component containing members 200 are taken out, the component containing members 200 of the next priority group are unloaded. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43.

In step S42, the controller 22 determines whether or not unloading of the component containing members 200 has been interrupted. When the unloading has been interrupted, the process advances to step S43, and when the unloading has not been interrupted, the component unloading process is terminated.

In step S43, after the component containing members 200 are taken out, the component containing members 200 of the interrupted group are unloaded. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43.

Component Unloading Process (Third Operation Example)

A component unloading process according to a third operation example is now described with reference to FIG. 8.

Also in the case of the third operation example, an unloading instruction for the component containing member 200 is given by the unloading instruction file as shown in the flow shown in FIG. 4. In this case, the unloading instruction file may store unloading groups created by the same process as in the first operation example. Furthermore, the unloading instruction file may store a group of only component IDs obtained by extracting component IDs, the producible time of which is less than the predetermined first threshold in step S14 of FIG. 5, at predetermined time intervals. That is, a group in the state of the unloading request list of FIG. 3 that is not grouped by the second threshold in step S16 of FIG. 5 may be stored in the unloading instruction file.

In the component unloading process according to the third operation example, the user selects the component containing member 200 to be prioritized and sets the priority.

Figure 8:
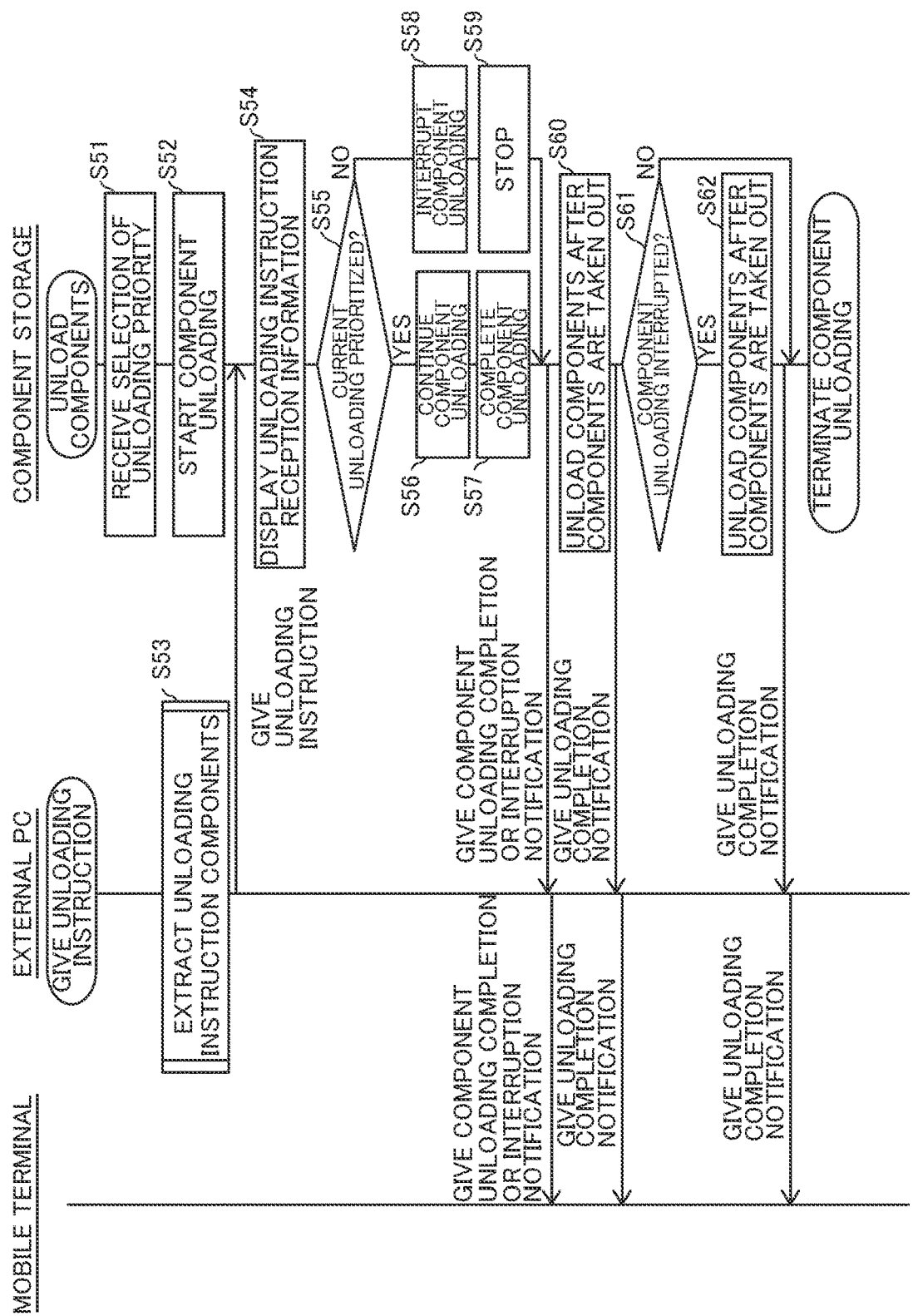
FIG. 8 is a sequence diagram for illustrating a third operation example of the component mounting system according to the embodiment of the present disclosure.

In step S51 of FIG. 8, the component storage 20 (controller 22) receives selection of the unloading priority by the user. The user selects the unloading priority from a list of unloading requests (list of components IDs) other than the unloading instruction extracted from the component mounting device 15 by the external PC 30. For example, the user selects the unloading priority from the list of unloading requests for the component IDs of the setup change. In this case, the list of unloading requests for the component IDs of the setup change is stored in the shared folder that stores the unloading request list requested from the external PC 30 by changing the data format, or becomes a file that can be distinguished from the unloading instruction from the external PC 30 by being stored in a shared folder (a folder that can be accessed by both the external PC 30 and the component storage 20 (controller 22)), which is different from the shared folder that stores the unloading request list requested from the external PC 30. The user can give an unloading instruction by selecting the file displayed on the display 24. At this time, a display as to whether or not to select the priority is also displayed on the display 24. The user can select the unloading priority in this display. Then, the user selects the file, and selects the unloading priority. In step S52, the controller 22 starts component unloading.

In step S53, the unloading instruction components are extracted by the external PC 30, and the unloading instruction is transmitted. In step S54, the component storage 20 (controller 22) causes the display 24 to display unloading instruction reception information.

In step S55, the controller 22 determines whether or not the current unloading of the component containing members 200 is prioritized. When the current unloading of the component containing members 200 is prioritized, the process advances to step S56, and when unloading of the component containing members 200 for the unloading instruction based on step S53 is prioritized, the process advances to step S58.

In step S56, the current unloading of the component containing members 200 is continued. In step S57, the component unloading is completed. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43. The user who has received the notification of the completion of component unloading performs an operation to take out the component containing member 200 unloaded from the component storage 20.

In step S58, the current unloading of the component containing members 200 is interrupted. In step S59, the component unloading is stopped. Then, the controller 22 notifies the external PC 30 of the interruption of component unloading. The external PC 30 displays information on the interruption of component unloading on the display 33. In addition, the external PC 30 notifies the mobile terminal 40 of the interruption of component unloading. The mobile terminal 40 displays information on the interruption of component unloading on the display 43. The user who has received the notification of the completion of component unloading performs an operation to take out the component containing member 200 unloaded from the component storage 20 before the interruption.

In step S60, after the previous component containing members 200 are taken out, the component containing members 200 of the next priority group are unloaded. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43.

In step S61, the controller 22 determines whether or not unloading of the component containing members 200 has been interrupted. When the unloading has been interrupted, the process advances to step S62, and when the unloading has not been interrupted, the component unloading process is terminated.

In step S62, after the component containing members 200 are taken out, the component containing members 200 of the interrupted group are unloaded. Then, the controller 22 notifies the external PC 30 of the completion of component unloading. The external PC 30 displays information on the completion of component unloading on the display 33. In addition, the external PC 30 notifies the mobile terminal 40 of the completion of component unloading. The mobile terminal 40 displays information on the completion of component unloading on the display 43.

Advantageous Effects of this Embodiment

According to this embodiment, the following advantageous effects are achieved.

According to this embodiment, as described above, the controller 22 is configured to control the order in which the component containing members 200 are unloaded based on the unloading priority when a plurality of component containing members 200 are scheduled to be unloaded. Accordingly, the component containing members 200 of the type of high-priority components E that needs to be quickly supplied can be preferentially unloaded from the component storage 20, and thus the components E can be quickly supplied to the component mounting device 15 that requires component supply. Thus, temporary interruption of the operation of the component mounting device 15 to mount the components E on the board S can be significantly reduced or prevented, and thus a decrease in the efficiency of the operation to mount the components E on the board S due to the unloading status of the components E from the component storage 20 can be significantly reduced or prevented.

According to this embodiment, as described above, the controller 22 is configured to control the order in which the component containing members 200 are unloaded based on the priority determined based on a period of time during which mounting on the board S can be continued with the remaining components E in the component mounting device 15. Accordingly, the component containing members 200 of the components E, which have a short period of time during which mounting of the components E can be continued, can be preferentially unloaded from the component storage 20, and thus temporary interruption of the operation of the component mounting device 15 to mount the components E on the board S can be effectively significantly reduced or prevented.

According to this embodiment, as described above, the component mounting system 100 includes the external PC 30 configured to determine the unloading priority of the component containing members 200 based on the information on the number of remaining components transmitted from the component mounting device 15 at the predetermined timing. Accordingly, the unloading priority of a plurality of component containing members 200 can be easily determined by the external PC 30 based on the information on the number of remaining components in the component mounting device 15.

According to this embodiment, as described above, the external PC 30 is configured to create the unloading groups of the component containing members 200 based on the unloading priority. Accordingly, the component containing members 200 having the same priority can be set as the same unloading group, and the unloading priority can be determined.

According to this embodiment, as described above, the controller 22 is configured to perform a control to unload the component containing members 200 for each unloading group classified based on the unloading priority. Accordingly, the component containing members 200 having a high priority can be collectively unloaded as an unloading group.

According to this embodiment, as described above, the controller 22 is configured to control the order of unloading such that the turn of the component containing member 200 having a high unloading priority is advanced when the request to unload the component containing member 200 having a high unloading priority arrives while the component containing member 200 is being unloaded. Accordingly, the order of unloading can be changed even during unloading of the component containing member 200, and thus an increase in the time required to unload the component containing member 200 of the type of components E that needs to be quickly supplied can be more effectively significantly reduced or prevented.

According to this embodiment, as described above, the controller 22 is configured to perform a control to interrupt a process to sequentially unload a plurality of component containing members 200 when the request to unload the component containing member 200 having a high unloading priority arrives during the process to sequentially unload the plurality of component containing members 200, and unload the component containing member 200 having a high unloading priority. Accordingly, unloading of the component containing members 200 of a high-priority unloading group can be started without waiting for unloading of all the component containing members 200 being processed.

According to this embodiment, as described above, the component containing members 200, the unloading of which is interrupted, are the component containing members 200 that are supplied to the component mounting device 15 and set up in order to start component mounting corresponding the production of the changed type of board S on which the components E are mounted by the component mounting device 15. Accordingly, the unloading priority of the component containing members 200 to be set up is relatively low, and thus the influence on the operation to mount the components E on the board S can be significantly reduced or prevented even when the unloading is interrupted.

According to this embodiment, as described above, the controller 22 is configured to control the order in which the component containing members 200 are unloaded based on the priority set by the user. Accordingly, the component containing members 200 can be quickly unloaded according to the user's request.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the controller configured to control the order in which the component containing members are unloaded is provided in the component storage has been shown in the aforementioned embodiment, the present disclosure is not restricted to this. In the present disclosure, the controller configured to control the order in which the component containing members are unloaded may be provided separately from the component storage. Alternatively, the controller configured to control the order in which the component containing members are unloaded may be provided integrally with the priority determiner configured to determine the priority.

While the example in which the component containing members are reels on which tapes that hold a plurality of components are wound has been shown in the aforementioned embodiment, the present disclosure is not restricted to this. In the present disclosure, the component containing members may be trays on which a plurality of components are placed. Alternatively, the component containing members may be sticks that store components adjacent to each other in the longitudinal direction of a long case and supply the components one by one from an opening of the end face orthogonal to the longitudinal direction.

While the example in which the three component mounting devices are provided on one component mounting line has been shown in the aforementioned embodiment, the present disclosure is not restricted to this. In the present disclosure, two or less or four or more component mounting devices may be provided on one component mounting line.

While the example in which one component storage is provided has been shown in the aforementioned embodiment, the present disclosure is not restricted to this. In the present disclosure, a plurality of component storages may be provided.

While the control process is described, using the flow described in a manner driven by a flow in which processes are performed in order along a process flow for the convenience of illustration in the aforementioned embodiment, the present disclosure is not restricted to this. In the present disclosure, the control process may be performed in an event-driven manner in which processes are performed on an event basis. In this case, the process may be performed in a complete event-driven manner or in a combination of an event-driven manner and a manner driven by a flow.

What is claimed is:

1. A component mounting system comprising:
a component mounting device mounting a component on a board;
a component storage configured to store a plurality of component containing members containing a plurality of the components to be mounted on the board by the component mounting device; and
a controller configured to control an unloading operation of the component storage wherein the controller controls an order of unloading in which a plurality of the component containing members scheduled to be unloaded are unloaded from the component storage to an unloading port for delivery to the component mounting device based on an initial unloading priority,
wherein the controller is configured to receive an updated unloading priority during the unloading operation and check if a component containing member currently being unloaded in the unloading operation is a high priority component containing member with a highest priority based on the updated unloading priority,
wherein if the component containing member currently being unloaded in the unloading operation is not the high priority component containing member, the controller interrupts the unloading operation of the component containing member currently being unloaded and controls the component storage to immediately unload the high priority component containing member.

2. The component mounting system according to claim 1, wherein the controller is configured to control the order of unloading in which the component containing members scheduled to be unloaded are unloaded based on the initial unloading priority determined based on a period of time during which mounting on the board can be continued with remaining components in the component mounting device.

3. The component mounting system according to claim 2, further comprising: a priority determiner determining the initial unloading priority of the component containing members scheduled to be unloaded based on information on a number of remaining components transmitted from the component mounting device at a predetermined timing.

4. The component mounting system according to claim 3, wherein the priority determiner is configured to create an unloading group of the component containing member based on the initial unloading priority.

5. The component mounting system according to claim 4, wherein the priority determiner is configured to create a plurality of unloading groups of the component containing members scheduled to be unloaded based on the initial unloading priority; and
the controller is configured to perform a control to unload the component containing members scheduled to be unloaded for each unloading group classified based on the initial unloading priority.

6. The component mounting system according to claim 2, wherein the controller is configured to control the order of unloading in which the component containing members are unloaded based on the updated unloading priority set by a user.

7. The component mounting system according to claim 1, wherein the component containing members which are not the high priority component containing member, unloading of which is interrupted when the updated unloading priority is received, are the component containing members that are supplied to the component mounting device and set up in order to start component mounting.

8. The component mounting system according to claim 1, wherein the controller is configured to control the order of unloading in which the component containing members are unloaded based on the updated unloading priority set by a user.

9. A component mounting method comprising:
mounting a component on a board by a component mounting device;
unloading, from a component storage, a plurality of component containing members containing a plurality of the components to be mounted on the board by the component mounting device; and
controlling an unloading operation of the component storage including controlling an order of unloading in which a plurality of the component containing members scheduled to be unloaded are unloaded to an unloading port for delivery to the component mounting device based on an initial unloading priority,
wherein the controlling of the order in which the component containing member is unloaded includes receiving an updated unloading priority during the unloading operation and checking if a component containing member currently being unloaded in the unloading operation is a high priority component containing member with a highest priority based on the updated unloading priority, wherein if the component containing member currently being unloaded in the unloading operation is not the high priority component containing member, the controller interrupts the unloading operation of the component containing member currently being unloaded and controls the component storage to immediately unload the high priority component containing member.

10. The component mounting method according to claim 9, wherein the controlling of the order of unloading in which the component containing members scheduled to be unloaded are unloaded includes controlling the order in which the component containing members scheduled to be unloaded are unloaded based on the initial unloading priority determined based on a period of time during which mounting on the board can be continued with remaining components in the component mounting device.

11. The component mounting method according to claim 10, further comprising: determining the initial unloading priority of the component containing members scheduled to be unloaded based on information on a number of remaining components transmitted from the component mounting device at a predetermined timing.

12. The component mounting method according to claim 11, wherein the determining of the initial unloading priority of the component containing member includes creating an unloading group of the component containing member based on the initial unloading priority.

13. The component mounting method according to claim 12, wherein the priority determiner is configured to create a plurality of unloading groups of the component containing members scheduled to be unloaded based on the initial unloading priority; and
the controlling of the order in which the component containing member s scheduled to be unloaded are unloaded includes performing a control to unload the component containing member s scheduled to be unloaded for each unloading group classified based on the initial unloading priority.

* * * * *